(12) United States Patent
Maneatis

(10) Patent No.: US 7,078,977 B2
(45) Date of Patent: Jul. 18, 2006

(54) FAST LOCKING PHASE-LOCKED LOOP

(75) Inventor: John G. Maneatis, Los Altos, CA (US)

(73) Assignee: True Circuits, Inc., Los Altos, CA (US)

( * ) Notice: Subject to any disclaimer, the term of this patent is extended or adjusted under 35 U.S.C. 154(b) by 22 days.

(21) Appl. No.: 10/658,120

(22) Filed: Sep. 8, 2003

(65) Prior Publication Data

US 2004/0135639 A1 Jul. 15, 2004

Related U.S. Application Data

(60) Provisional application No. 60/408,702, filed on Sep. 6, 2002.

(51) Int. Cl.
*H03L 7/00* (2006.01)

(52) U.S. Cl. .......................... 331/16; 331/17; 331/1 A; 331/34; 331/10; 327/156; 327/157

(58) Field of Classification Search ................ 331/16, 331/17, 1 A, 34, 10; 327/156, 157
See application file for complete search history.

(56) References Cited

U.S. PATENT DOCUMENTS

| | | | |
|---|---|---|---|
| 4,608,530 A | 8/1986 | Bacrania | |
| 4,644,536 A | 2/1987 | Utsumi | |
| 4,792,768 A | 12/1988 | Fried et al. | |
| 5,043,677 A | 8/1991 | Tomassetti et al. | |
| 5,144,156 A | 9/1992 | Kawasaki | |
| 5,285,114 A | 2/1994 | Atriss et al. | |
| 5,375,148 A | 12/1994 | Parker et al. | |
| 5,424,689 A * | 6/1995 | Gillig et al. | .................. 331/17 |
| 5,508,660 A | 4/1996 | Gersbach et al. | |
| 5,512,816 A | 4/1996 | Lambert | |
| 5,629,650 A | 5/1997 | Gersbach et al. | |
| 5,687,201 A | 11/1997 | McClellan et al. | |
| 5,705,947 A | 1/1998 | Jeong | |

(Continued)

FOREIGN PATENT DOCUMENTS

JP 2002-217721 8/2002

OTHER PUBLICATIONS

*A Fully-Configurable GSM BTS Controller and GMSK-EDGE Base-Band Transmitter IC*, Delmont et al., *IEEE Solid-State Conference*, pp. 352-353, Feb. 5-7, 2001.

*Primary Examiner*—Michael B. Shingleton
(74) *Attorney, Agent, or Firm*—Alleman Hall McCoy Russell & Tuttle LLP

(57) ABSTRACT

A phase-locked loop system, including a voltage controlled oscillator coupled with an error detector in a feedback configuration, so as to produce an output signal having a desired characteristic that is based on a reference signal. The system also includes a charge pump system coupled with the voltage controlled oscillator and configured to produce currents to control phase and frequency of the output signal. The charge pump system includes at least two charge pumps, one being configured to effect more rapid changes in the output signal than the other. This charge pump may be configured to deliver a higher charge pump current than the other charge pump, and/or may be activated intermittently upon detection of cycle slippage or another condition detectable during operation of the phase-locked loop system.

33 Claims, 7 Drawing Sheets

U.S. PATENT DOCUMENTS

| | | |
|---|---|---|
| 5,727,037 A | 3/1998 | Maneatis |
| 5,731,696 A | 3/1998 | Pennisi et al. |
| 5,757,238 A | 5/1998 | Ferraiolo et al. |
| 5,870,003 A | 2/1999 | Boerstler |
| 5,880,579 A | 3/1999 | Wei et al. |
| 5,900,784 A | 5/1999 | O'Sullivan |
| 5,945,855 A | 8/1999 | Momtaz |
| 5,959,502 A | 9/1999 | Ovens et al. |
| 5,986,485 A | 11/1999 | O'Sullivan |
| 6,011,822 A | 1/2000 | Dreyer |
| 6,043,695 A | 3/2000 | O'Sullivan |
| 6,043,715 A | 3/2000 | Bailey et al. |
| 6,054,882 A | 4/2000 | Izumikawa |
| 6,067,336 A | 5/2000 | Peng |
| 6,075,406 A | 6/2000 | Lee et al. |
| 6,107,849 A | 8/2000 | Williams et al. |
| 6,107,889 A | 8/2000 | Strange et al. |
| 6,111,470 A | 8/2000 | Dufour |
| 6,118,346 A * | 9/2000 | Olgaard .................. 331/17 |
| 6,124,741 A | 9/2000 | Arcus |
| 6,124,755 A | 9/2000 | Parker et al. |
| 6,181,210 B1 | 1/2001 | Wakayama |
| 6,201,380 B1 | 3/2001 | Tsujino et al. |
| 6,215,363 B1 | 4/2001 | Conta et al. |
| 6,222,421 B1 | 4/2001 | Kiyose |
| 6,242,897 B1 | 6/2001 | Savage et al. |
| 6,262,610 B1 | 7/2001 | Lo et al. |
| 6,265,859 B1 | 7/2001 | Datar et al. |
| 6,275,097 B1 | 8/2001 | Liang et al. |
| 6,326,852 B1 | 12/2001 | Wakayama |
| 6,329,882 B1 | 12/2001 | Fayneh et al. |
| 6,566,970 B1 | 5/2003 | Injino, Jr. |

* cited by examiner

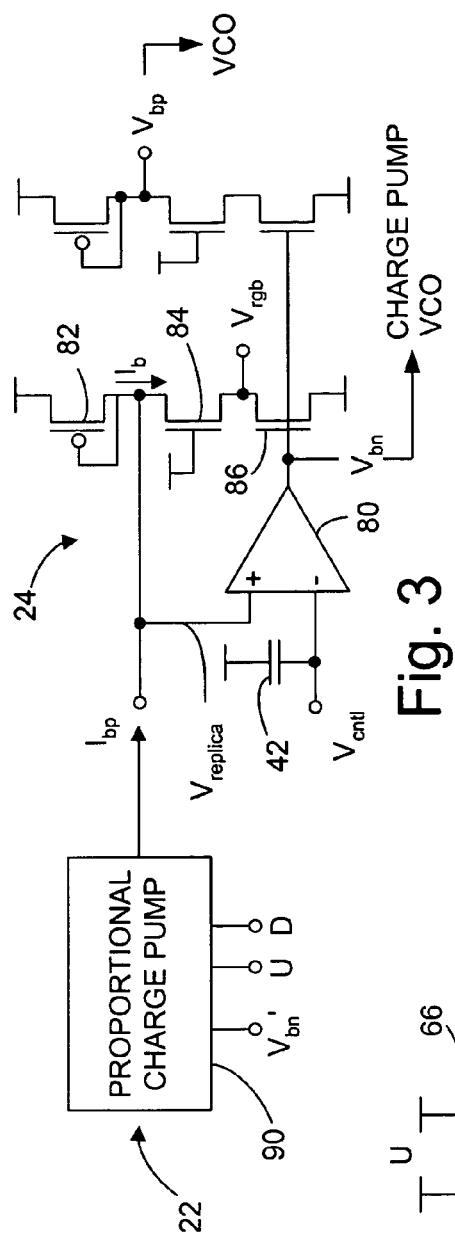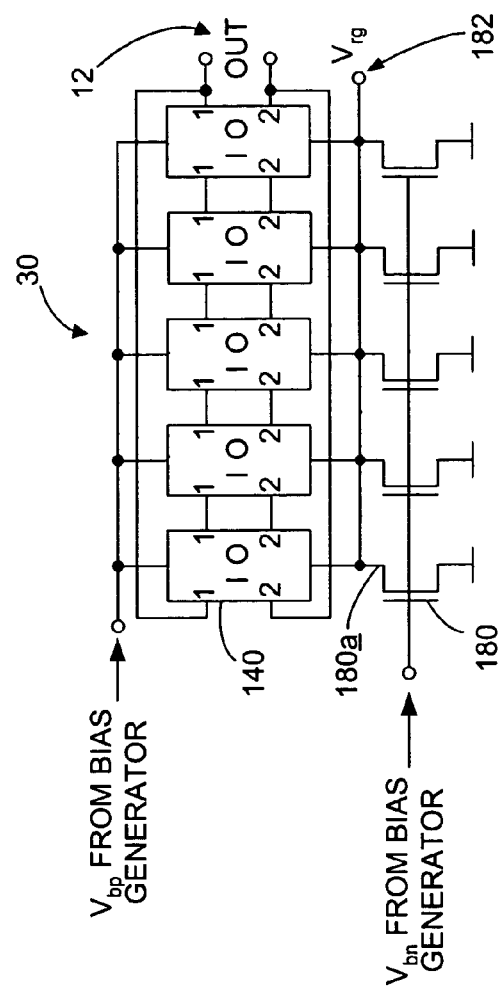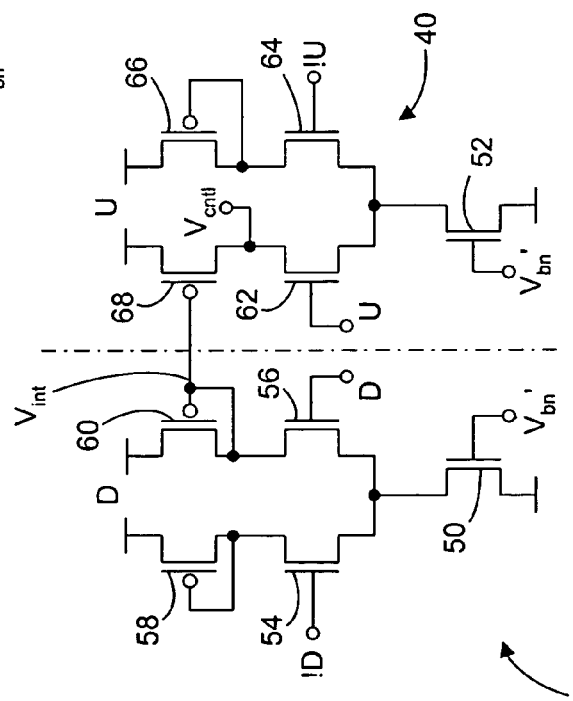
Fig. 3
Fig. 4
Fig. 2

FAST LOCKING PHASE-LOCKED LOOP

CROSS REFERENCE TO RELATED APPLICATION

This application claims the benefit under 35 U.S.C. § 119(e) of U.S. provisional patent application Ser. No. 60/408,702, filed Sep. 6, 2002, which is hereby incorporated by reference in its entirety for all purposes.

BACKGROUND

Phase-locked loop (PLL) systems are used extensively in analog and digital circuits. These systems typically include a phase frequency detector (PFD), charge pump and voltage controlled oscillator (VCO) connected in a feedback configuration. The VCO produces the output signal of the PLL, and the various components of the PLL cooperate to cause the output signal to tend toward and eventually lock on to a desired output frequency and/or phase, which are based on a reference signal applied as an input to the PFD. For example, many PLL systems are configured to produce an output signal having the same frequency as the input signal, or having an output frequency which is a factor x/y of the input frequency.

The output signal tracks the desired output frequency and/or phase through operation of a feedback mechanism, in which the output of the VCO is fed back to the PFD as a feedback signal via a feedback path. The phase frequency detector receives the reference signal and the feedback signal, and produces an error signal based on discrepancies between the actual phase and frequency of the output signal and the desired phase and frequency. The error signals from the PFD are applied to the charge pump, which in turn produces signals that control the oscillation frequency of the VCO.

A design consideration that can be important in PLL systems is the behavior of the PLL during startup or at other times when there is a significant difference between the actual phase/frequency of the output signal and its desired value. During normal operation, it is often desirable to operate the PLL at a relatively low bandwidth, in order to maintain lock and minimize tracking jitter. However, low bandwidth operation can significantly slow the locking process during startup or other times when a large adjustment in the output signal is desired. Prior systems have addressed this by temporarily elevating the bandwidth of the PLL in order to make a rapid initial adjustment to the output signal. However, many prior system suffer from disadvantages related to the timing at which they switch back into their normal lower-bandwidth state of operation. Commonly, this timing is determined in advance based on rough estimates of how the PLL will perform in a given operational setting. Typically, the timing is conservative and the transition to low bandwidth operation occurs sooner than necessary, because many PLL circuits cannot tolerate the overshoot and other potential consequences of a late transition to low bandwidth operation. Accordingly, many prior systems take longer than necessary to achieve lock during startup and other situations where relatively large corrections to the output signal are needed.

BRIEF DESCRIPTION OF THE DRAWINGS

FIG. 2 depicts a charge pump that may be implemented with the system of FIG. 1.

FIG. 3 depicts a charge pump and bias generator that may be implemented with the system of FIG. 1.

FIG. 4 depicts a multistage voltage controlled oscillator that may be implemented with the system of FIG. 1.

DETAILED DESCRIPTION

Figure 1:
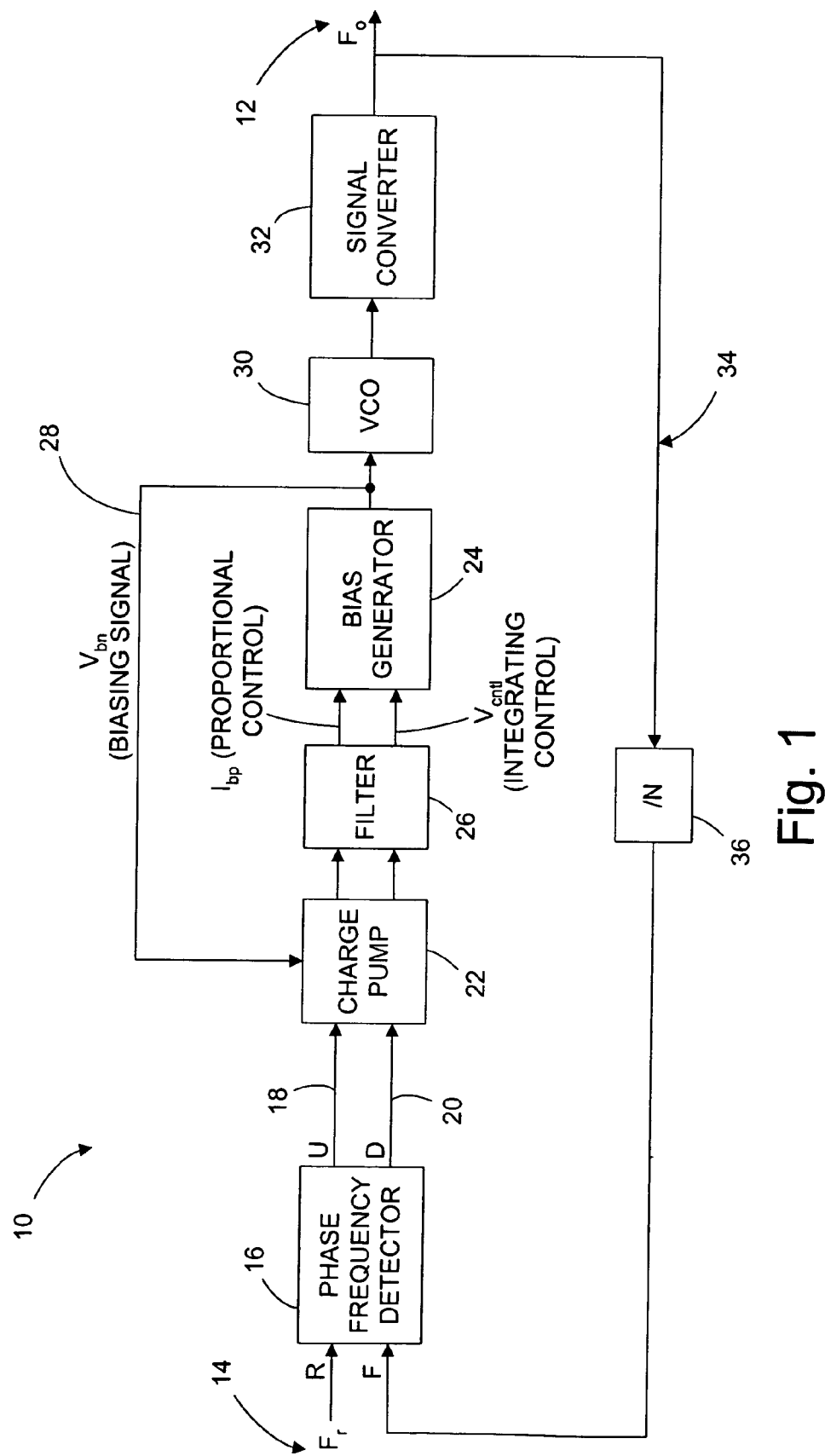
FIG. 1 is a block diagram of a phase-locked loop system according to the present description.

A phase-locked loop (PLL) system is depicted generally at 10 in FIG. 1. PLL system 10 is configured to produce an output signal 12 ($F_o$) in response to application of a reference signal 14 ($F_r$), such that the output signal tends toward a desired output frequency which is based on reference signal 14. For example, the output signal may have the same frequency as the input reference signal, or the output frequency may be a rational factor x/y of the reference frequency. U.S. patent application Ser. No. 10/059,503, filed Jan. 28, 2002 and U.S. patent application Ser. No. 10/059,913, filed Jan. 28, 2002 provide examples of PLL systems, methods and components that may be used in connection with the systems and methods described herein, the disclosures of which are hereby incorporated by reference in their entireties for all purposes.

As indicated, PLL system 10 operates via a feedback arrangement, where output signal 12 is fed back and applied as a feedback input F to an error detector. The present description will primarily address phase-locked loops which implement the error detector as a phase frequency detector (PFD) 16. It will be appreciated, however, that the present disclosure is applicable to a wide variety of settings where error detection and feedback mechanisms are employed to cause an output signal to have a desired characteristic. For example, other types of error detectors that may be used with the embodiments described herein include XOR devices, mixers, edge-triggered latches and sampling flip-flops.

Still referring to FIG. 1, PFD 16 also receives reference signal 14 as a reference input R. PFD 16 detects phase/frequency differences between the signals applied to the reference and feedback inputs, and produces one or more outputs based on the detected differences. Typically, as indicated, the PFD output will take the form of a "U" signal 18, a "D" signal 20, or a combination of those signals. PFD 16 produces the U signal where the actual, or instantaneous, output frequency is lower than the desired output frequency, and/or where the output signal lags the desired output in phase. The D signal is produced where the actual output frequency is higher than the desired output frequency, and/or where the output signal leads the desired output in phase.

PLL system 10 typically also includes a charge pump system 22, bias generator 24 and one or more filters such as low pass filter 26. These components respond to the U and D signals to produce a control signal 28 ($V_{bn}$) that is applied to control a voltage controlled oscillator (VCO) 30. $V_{bn}$ may also be referred to as a biasing signal, because it typically is used to control various current sources and other components in the phase-locked loops of the present description. For example, as depicted, $V_{bn}$ may be fed back to charge pump system 22 to dynamically bias operation of the charge pump, as will be explained in more detail. Based on application of biasing signal $V_{bn}$, VCO 30 produces output signal 12, either directly or with subsequent processing by signal converter 32 or other components.

For example, in an implementation where output signal 12 ($F_o$) is to track reference signal 14 ($F_r$) without frequency multiplication or division, assume at a given instant that output signal 12 has a lower frequency than the applied reference signal 14. PFD 16 detects this difference and responds by producing one or more U pulses 18. The U pulses then cause a change in biasing signal 28 (resulting, for example, in an increase in current supplied to VCO 30) that produces an increase in the phase and/or frequency of the VCO output signal $F_o$. The charge pump continues to output U pulses until the output frequency equals the reference frequency.

As indicated, output signal 12 may undergo various processing within feedback path 34 before being applied as the feedback input to PFD 16. For example, in PLL applications where the reference frequency is multiplied by a factor to produce the output frequency, the feedback path typically will include a divider 36 and/or other components.

FIGS. 2, 3 and 4 respectively depict in further detail charge pump system 22, bias generator 24 and VCO 30 according to the present description. Charge pump system 22 typically includes an integrating charge pump 40 configured to provide output to the $V_{cntl}$ node of bias generator 24 in response to error signals received from PFD 16 (i.e., U and/or D pulses). The level of $V_{cntl}$ is maintained at the input of bias generator 24 via capacitor 42. Charge pump 40 causes the $V_{cntl}$ level to increase, decrease or remain constant based on the U and D signals applied from PFD 16. Based on $V_{cntl}$, bias generator 24 produces biasing signal $V_{bn}$, which is applied to the current sources that drive charge pump 40 and VCO 30. At charge pump 40, biasing signal $V_{bn}$ essentially controls the sensitivity of the charge pump to the U and D signals. In other words, the biasing signal controls the extent to which application of these signals causes the $V_{cntl}$ output to vary. At VCO 30, biasing signal $V_{bn}$, acts as the primary input to the oscillator, and controls its output frequency.

As seen in FIGS. 1 and 2, PFD 16 typically includes separate output lines for the U and D signals. Accordingly, charge pump 40 may include a U portion and a D portion configured to receive the corresponding error signals from the PFD. Each portion contains one or more current paths which are controlled by biasing signal $V_{bn}$ and through application of the error signals received from PFD 16. The currents flowing through the paths create various node voltages which ultimately determine the behavior of the control signal $V_{cntl}$.

Referring particularly to FIG. 2, transistors 50 and 52 act as current sources. These transistors are biased by $V_{bn}'$, a mirrored copy of biasing signal $V_{bn}$, as will be explained below. Transistors 54 and 56 steer current into one of two diode-connected transistors 58 and 60, and transistors 62 and 64 steer a matched current into the depicted $V_{cntl}$ terminal, or into diode-connected transistor 66. The current mirror formed by transistors 60 and 68 sources as much charge into $V_{cntl}$ as is drained through transistor 60, subject to certain limitations discussed below. Because transistors 54, 56, 62 and 64 control activation of the various current paths within the charge pump in response to the U and D error signals, those transistors may be collectively referred to as a switching device.

From the above, it should be understood that application of the U signal from PFD 16 causes $V_{cntl}$ to fall, while application of the D signal causes $V_{cntl}$ to rise. As will be explained in more detail, decreases in $V_{cntl}$ produce an increase in biasing signal $V_{bn}$ and an increased bias current Ib within bias generator 24 (FIG. 3). The increase in biasing signal $V_{bn}$ causes the current supplied to VCO 30 to rise. This increased VCO current produces positive phase and/or frequency adjustments to output signal 12. Conversely, when $V_{cntl}$ increases (e.g. from pulsing of the D signal), the bias current $I_b$ and biasing signal $V_{bn}$ drop. This decreases the current supplied to VCO 30, which in turn produces negative adjustment to the phase and/or frequency of output signal 12.

In typical implementations of the present description, the error signals output by PFD 16 tend to have a stabilizing effect upon the output signal when the system is in lock. Conversely, in the absence of either a U or a D signal (as might occur if little or no discrepancy were detected between the two signals applied to the inputs of PFD 16), output signal 12 tends to drift about the desired output frequency instead of achieving a stable lock. The range of alignments in which this drift effect occurs is known as a "dead band." The dead band results partly from the narrowing of the U and D pulses as the system approaches lock. Narrower pulses are often filtered out by various components in the system, such that the system is unable to correct discrepancies between the output signal and the desired output frequency until those discrepancies exceed some threshold magnitude. The resulting output jitter is often undesirable.

To eliminate or reduce this undesired jitter in the output signal, PFD 16 may be configured to emit both U and D pulses when the PFD inputs are aligned or nearly aligned. When only one of the signals is applied, charge pump system 22 pumps a net charge to bias generator 24, in order to produce variation in the phase and/or frequency of the output signal. By contrast, where both the U and D signals are applied together (simultaneously) to charge pump 40, the charge pump should pump no net charge.

Typically, when U and D are pulsed simultaneously to avoid a dead band, the respective effects of those error signals are at least partially canceled via operation of the current mirror defined by transistors 60 and 68 (FIG. 2). Theoretically, the current mirror ensures that the current through transistors 60 and 68 will be equal, leaving no net output charge from charge pump 40, and ensuring no variation of the $V_{cntl}$ level on capacitor 42. If a net charge were pumped in such a situation, the variation in $V_{cntl}$ would introduce an undesired variation in output signal 12. Specifically, such charge leakage can produce undesired static phase offset in output signal 12.

The current through transistors 60 and 68 would be equal if charge pump 40 contained an ideal current mirror and two ideal switchable current sources with infinite output impedance. However, these devices typically are not ideal in practice, and the phase-locked loops described herein normally include some mechanism to force the voltage $V_{cntl}$ to equal the $V_{int}$ gate voltage on transistor 60. This causes the charge pump output current to be zero when U and D are asserted, leaving no net effect upon the $V_{cntl}$ voltage stored on capacitor 42.

Bias generator 24 dynamically varies its output biasing signal $V_{bn}$ in order to balance the charge pump output when U and D signals are simultaneously applied to charge pump 40. As the current being steered through transistor 60 grows larger, the voltage on $V_{int}$ grows smaller. Bias generator 24 is configured to find and supply a $V_{bn}$ level for which the voltage $V_{int}$ will equal the voltage $V_{cntl}$. Bias generator 24 contains an amplifier 80 and a replica of the current path through the D side of charge pump 40 when the D signal is pulsed. The replica current path includes transistors 82, 84 and 86. The negative feedback through the amplifier causes $V_{replica}$ to be equal to $V_{cntl}$ by appropriately adjusting the biasing current $I_b$ set by $V_{bn}$.

With both U and D high, the activated current path on the left side of the charge pump will look identical to the replica current path within bias generator 24, so that $V_{int}$ will equal $V_{replica}$, which the bias generator forces to equal $V_{cntl}$. The right side of charge pump 24 is similar, but the gate of transistor 68 is not connected to its drain. However, like transistor 60, both the gate and drain voltages will be $V_{cntl}$. Thus, the right side of the charge pump should behave identically to the left side so that the current sourced by transistor 68 will exactly match the current sunk by transistor 62 leaving no net output current.

With no output current from the charge pump when both U and D are high, there should be no net charge output when U and D are pulsed identically, as would occur in a locked condition with zero static phase offset. Phase-locked loops with this arrangement may thus be considered self-biased phase-locked loops.

As should be appreciated from the above discussion, biasing signal $V_{bn}$ is dynamically generated free of any external bias levels. In addition to balancing operation of charge pump system 22, the biasing signal dynamically controls other current sources within phase-locked loop 10. Also, as will be explained in more detail, the dynamic operation of bias generator 24 causes the bias generator to internally generate a supply voltage which matches the supply voltage in VCO 30. Accordingly, the PLL systems of the present description are dynamically self-biasing.

As indicated above, charge pump system 22 typically includes an integrating charge pump 40 to provide integrating control over output signal 12. In many cases, it will also be desirable to employ proportional control to achieve stable feedback. Accordingly, as seen in FIG. 3, charge pump system 22 may also include a proportional charge pump 90.

Typically, integrating charge pump 40 and proportional charge pump 90 are similar, if not identical, in construction and internal operation. Both pumps respond to the U and D error signals by pumping charge for application to bias generator 24, in order to produce adjustments to output signal 12. Also, both pumps are biased via feedback coupling of biasing signal $V_{bn}$ (or mirrored copy $V_{bn}'$) from bias generator 24.

The two charge pumps are distinguished by the signal path to bias generator 24, and by the way pumped charge is applied to the bias generator. Integrating charge pump 40 pumps its output charge along an integrating control path defined between $V_{cntl}$ node of charge pump 40 and the $V_{cntl}$ input terminal of bias generator 24. The pumped charge is integrated by and stored at capacitor 42. The voltage on this capacitor represents the net accumulated charge resulting from all of the previously applied U and D signals to integrating charge pump 40.

By contrast, proportional charge pump 90 pumps its output charge via a proportional control path to the $V_{replica}$ node of bias generator 24. The output charge typically is in the form of a current pulse $I_{bp}$ which is added to or subtracted from the $I_b$ bias current flowing within the replica current path in bias generator 24. In some cases, there may be various capacitances introduced into the proportional control path, though these capacitances typically are much smaller than capacitor 42. Accordingly, the proportional control provided by charge pump 90 normally involves small phase adjustments to output signal 12, where the integrating control provided by integrating charge pump 40 typically involves more gradual adjustments to the frequency of the output signal, due to the accumulated charge on capacitor 42 and the filtering effects produced by the relatively large capacitance.

Figure 5:
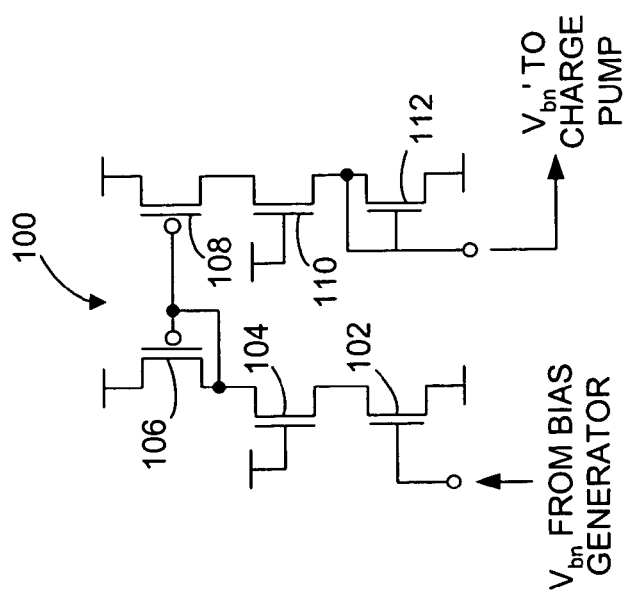
FIG. 5 depicts a circuit that may be implemented to isolate biasing signals within the charge pumps of the present description.

As indicated above, when phase-locked loop 10 is in lock, PFD 16 emits small, equal-sized U and D pulses to charge pump system 22. These pulses can capacitively couple into biasing signal $V_{bn}$ through transistors 54, 56, 62, 64, 50 and 52 of integrating charge pump 40. Similar signal coupling can occur in proportional charge pump 90. The resulting periodic noise on biasing signal $V_{bn}$ may cause some cycle-to-cycle jitter, since the biasing signal is also used to drive VCO 30. As seen in FIG. 5, the charge pump system may include an isolated bias input path 100 to isolate biasing signal $V_{bn}$ and avoid the jitter described above.

As indicated in FIG. 5, isolated bias path 100 typically includes a number of transistors (e.g., transistors 102, 104, 106, 108, 110 and 112) which define a current mirror system. The current mirror system produces a mirrored copy $V_{bn}'$ of the $V_{bn}$ biasing signal generated by bias generator 24. The mirrored biasing signal $V_{bn}'$ is then used in the charge pumps, so that noise coupled onto it does not affect VCO 30. The left transistor stack essentially creates a local copy of a secondary biasing signal $V_{bp}$ generated by bias generator 24. In some settings, it may be desirable to directly use the secondary biasing signal in the right transistor stack, instead of generating a local copy.

U.S. Pat. No. 6,462,527, issued Oct. 8, 2002, provides additional examples of current mirroring devices that may be employed with the present description, the disclosure of which is hereby incorporated by reference in its entirety for all purposes.

As discussed above, bias generator 24 includes a feedback loop that actively tracks $V_{cntl}$ to generate a dynamic biasing signal which controls both the charge pump system 22 and VCO 30. For reasons explained below, it typically is important that this feedback loop exhibit a bandwidth response that is much faster than the overall bandwidth of the PLL system.

However, in some cases it will be desirable to couple components within the proportional control path (e.g., between proportional charge pump 90 and the $V_{replica}$ node of bias generator 24) that may affect the dynamic response of the bias generator feedback loop. Examples of such components may be found in co-pending U.S. patent application Ser. No. 10/059,945, filed Jan. 28, 2002, the disclosure of which is hereby incorporated by reference in its entirety for all purposes. The disclosure of this patent application describes components that may be coupled intermediate the charge pump system and bias generator in order to condition charge pump output for various reasons, for example in order to reduce or eliminate jitter in output signal 12.

Where these components are used, and in other cases, coupling proportional charge pump 90 and these components directly to bias generator 24 can increase the capacitance on $V_{replica}$. Large increases in this capacitance can destabilize the feedback loop within the bias generator. This can be countered with an increase in the capacitance on biasing signal $V_{bn}$, though such an increase would reduce the bandwidth of the bias generator, which in turn can reduce the supply and substrate noise rejection of the VCO, as will be explained below.

Figure 6:
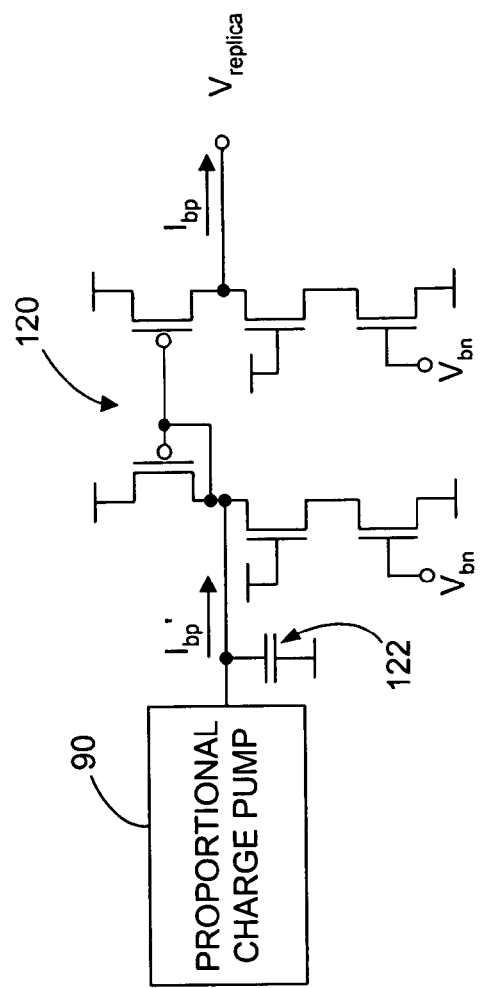
FIG. 6 depicts a current mirror system that may be employed within a proportional control path between the charge pumps and bias generators of the present description.

These issues may be addressed by providing proportional charge pump 90 with an isolated output 120 within the proportional control path, as seen in FIG. 6. Isolated output 120 includes a number of transistors which define a current mirror system. The current mirror system is pre-biased by biasing signal $V_{bn}$ from bias generator 24, and replicates initial output $I_{bp}'$ (but with opposite sign), so that output $I_{bp}$ is applied to the $V_{replica}$ node of the bias generator, as discussed above with reference to FIG. 3. The U and D inputs may be reversed on the proportional charge pump to compensate for the change in sign. The depicted current mirror system isolates proportional charge pump 90 from bias generator 24. This allows use of an arbitrary capacitance 122, or other components in the proportional control path, without affecting damping, bandwidth or other dynamic characteristics of the feedback loop contained within bias generator 24. Further filtering and signal isolation may be provided by cascading additional stages to the depicted isolation circuit.

As discussed above, it typically is desirable that phase-locked loop 10 maintain a stable lock even when faced with rapid changes in supply voltage or noise coupled into the system from the substrate or other sources. The systems described herein substantially reject effects due to supply variations and substrate noise because bias generator 24 is configured to maintain a constant bias current $I_b$ during $V_{dd}$ changes, and the supply current to VCO 30 matches this current in the bias generator. VCO 30 thus operates at a constant current, and thus a constant operating frequency, through changes in the voltage supply.

Figure 8:
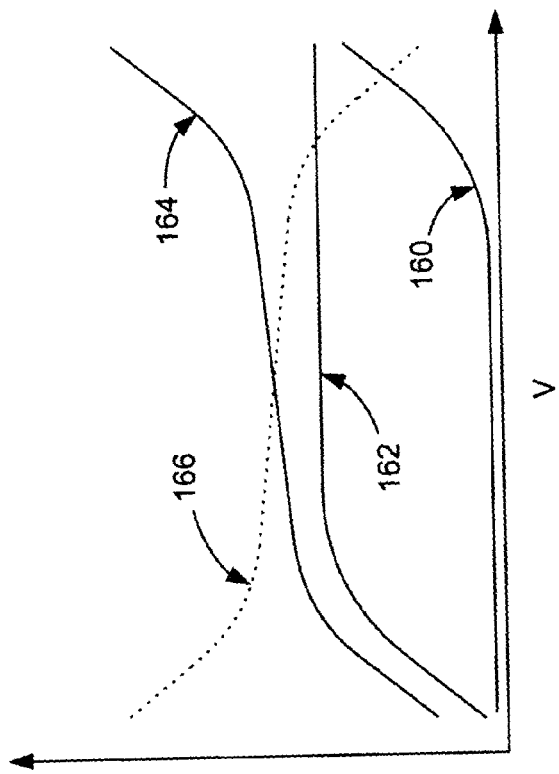
FIG. 8 depicts I–V characteristics of various components shown in FIG. 7.
Figure 7:
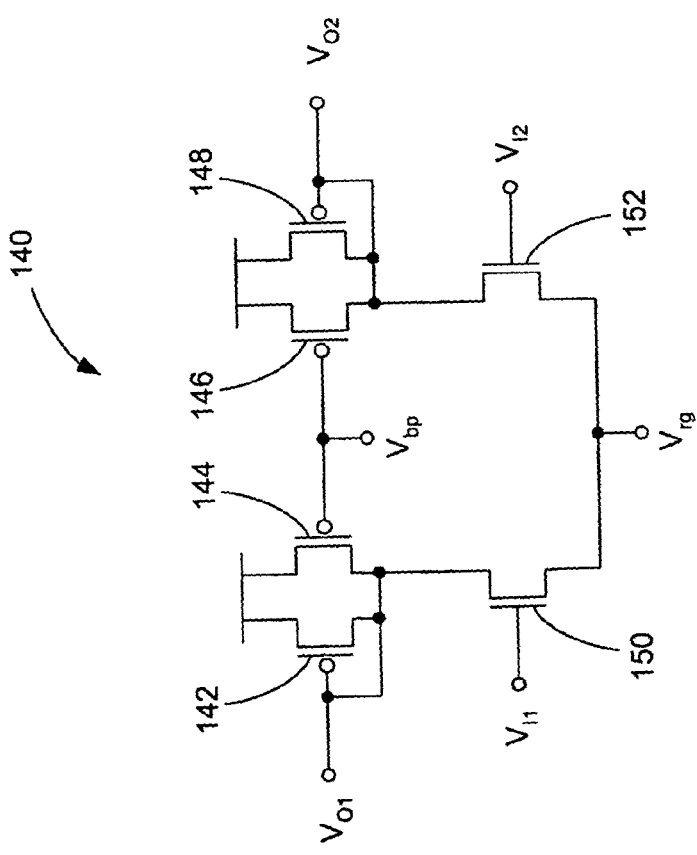
FIG. 7 depicts an illustrative oscillator stage that may be implemented with the system shown in FIG. 1.
Figure 9:
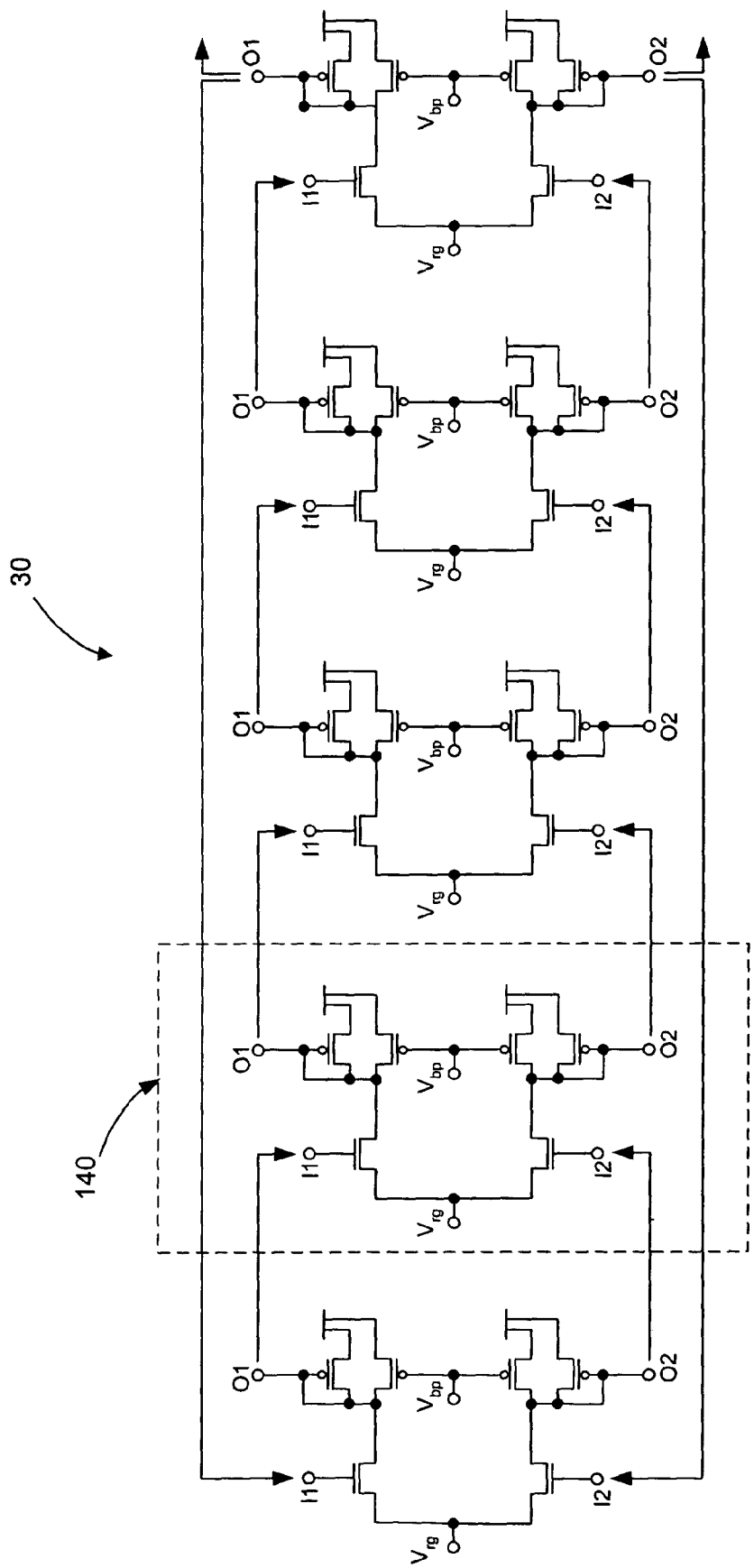
FIG. 9 depicts a multistage voltage controlled oscillator according to the present description.

As seen in FIG. 4, VCO 30 may include multiple VCO stages 140. FIG. 7 depicts an exemplary embodiment of one of VCO stages 140, FIG. 8 depicts I–V characteristics of various elements in VCO stage 140, and FIG. 9 provides a more detailed depiction of the multiple stage configuration. Referring particularly to FIG. 7, VCO stage 140 includes two load elements, one being formed by transistors 142 and 144, the other being formed by transistors 146 and 148. As indicated, transistor 142 typically is a diode-connected PMOS device, with an I–V characteristic as shown by curve 160 (FIG. 8). Transistor 144 is connected as a current source biased by $V_{bp}$ with an I–V characteristic as shown by curve 162. $V_{bp}$ is a secondary biasing signal that is produced by the bias generator, as seen in FIG. 3. The I–V characteristic of the two devices (i.e., transistors 142 and 144) in parallel is the sum of curves 160 and 162, shown as curve 164. Curve 164 is symmetrical about the voltage $(V_{bp}+V_{dd})/2$, which is also the center of the swing of the VCO stage inputs and outputs. Secondary biasing signal $V_{bp}$ varies with $V_{bn}$ to ensure that the VCO stage operates within a symmetrical region of the load element characteristic.

The second load element (i.e., the load element formed by transistors 146 and 148) has similar I–V characteristics. When the inputs to the two load elements are differential, respective combined characteristics will be symmetrical and opposite, such that the second load element will have a combined characteristic as shown by dashed curve 166. As explained below, pseudo-differential configurations may be employed to ensure that the load element inputs are differential.

Typically, each load element of VCO stage 140 is coupled in series with an input transistor, respectively shown as transistors 150 and 152. Provided the input signals Vi1 and Vi2 to VCO stage 140 are differential, outputs Vo1 and Vo2 will be differential. Typically, one or more stages of the VCO implementations shown in FIGS. 4, 7 and 9 will be cross-coupled to maintain the differential relationship in the signals coming out of the buffer stages. Referring still to FIGS. 7 and 8, because the I–V curves of each load element are symmetrical about the center of the voltage swing, the supply current and supply resistance through the VCO stage will be constant, provided the input signals are differential. As indicated in FIG. 4, VCO 30 typically includes multiple stages connected in cascade fashion as a ring oscillator, such that outputs Vo1 and Vo2 of a given stage feed inputs Vi1 and Vi2 of the next stage. FIG. 9 depicts in more detail the interconnections between VCO stages 140. It has been determined that employing five VCO stages provides a suitable oscillatory response, though it should be appreciated that more or less than five stages may be used, as appropriate to a given setting.

The semiconductor devices used to construct bias generator 24 and the individual VCO stages are closely matched in order to match impedances between the bias generator and VCO. Specifically, in the $I_b$ current path within bias generator 24, current source transistor 86 faces an effective bias generator impedance formed by transistors 82 and 84. In VCO stage 140, transistors 142, 144, 146, 148, 150 and 152 are configured to match this impedance within the bias generator. Thus, VCO current source transistor 180 (FIG. 4) and the bias generator current source 86 theoretically face matched (i.e., identical or scaled) impedances. Scaled matching may be desirable in cases where it is advantageous to scale down the bias generator, for example by employing devices with narrower channel widths. Accordingly, it will be appreciated that matching effective impedances between the bias generator and VCO typically involves ensuring that the current densities within the relevant portions of the components are the same. Despite the matching configuration described above, there may be periodic variations in the resistance of the individual VCO stages, as will be explained below. In addition, as discussed above, the bias generator and charge pump systems of the present invention typically are matched. Accordingly, various semiconductor components within the charge pumps of the present invention provide effective impedances which are matched to the effective impedances within the oscillator stages.

As best seen in FIG. 4, VCO stages 140 typically are connected together via a regulated voltage connection (e.g., regulated ground connection $V_{rg}$) in order to cancel period fluctuations in the resistance of individual VCO stages. This connection is employed because the I–V characteristics discussed above with reference to FIG. 8 may deviate somewhat from being perfectly symmetrical about the center voltage $(V_{dd}+V_{bp})/2$. This asymmetry may occur due to physical device mismatch and/or from variations in transistor dynamics from ideal transistor models. In addition, in some cases there will be asymmetry in the rise and fall times of the inputs to each VCO stage 140. These non-ideal conditions can produce periodic fluctuations in the resistance of each VCO stage. During operation, the voltage controlled oscillator establishes a regulated VCO voltage, which is defined between the positive voltage supply ($V_{dd}$) and the regulated voltage node ($V_{rg}$). As will be discussed below, the oscillator may be configured such that the regulated voltage node is established with a regulated supply connection $V_{rs}$, with the regulated VCO voltage then being defined between the negative voltage supply ($V_{ss}$) and the regulated voltage node $V_{rs}$.

The regulated ground connection discussed above is typically implemented by delivering current to the VCO stages through regulated voltage node $V_{rg}$. Referring still to FIG. 4, each VCO stage 140 is driven by a current source transistor 180 biased by biasing signal $V_{bn}$. The individual current source transistors 180 collectively form the current source which drives the voltage controlled oscillator. As indicated, the output terminals 180a of the current source transistors may be shorted together at regulated voltage node 182 ($V_{rg}$). VCO stages 140 are thus coupled in parallel between the current source and the supply voltage $V_{dd}$, with current being delivered to the stages through regulated voltage node 182. This regulated ground connection cancels any low frequency periodic variations in the resistance of each VCO stage, and the remaining variations are reduced in magnitude and restricted to higher harmonics of the VCO oscillation frequency. The total resistance between node 182 and $V_{dd}$ is thus more nearly constant than the resistance of any one VCO stage. This nearly constant resistance, in series with a current supply formed by transistors biased by $V_{bn}$, keeps the voltage drop $V_{dd}-V_{rg}$ (i.e., the regulated VCO voltage) very close to constant.

If the current sources and transistors connected to node 182 were linear, then the time average of $V_{rg}$ over each cycle would converge to $V_{rgb}$ in bias generator 24 (FIG. 3). These devices are not linear, and these non-linearities result in an offset between the time-averaged value of $V_{rg}$ and $V_{rgb}$. This offset is a function of $V_{dd}$. Reducing the amplitude of variation of $V_{rg}$ reduces the effects of these non-linearities and reduces the offset between $V_{rg}$ and $V_{rgb}$. Since the frequency generated by the VCO is a function of its supply current, which depends on the voltage drop from $V_{dd}$ to $V_{rg}$ (the regulated VCO voltage), cyclic variations of $V_{rg}$ ultimately lead to output jitter induced by supply noise, as explained below. The regulated connection discussed above minimizes these cyclic voltage variations.

Noise rejection in VCO 30 depends on a VCO current supply that remains undisturbed in the face of changes to $V_{dd}$ (or $V_{ss}$). The VCO current supply is controlled by bias generator 24, which in turn is controlled by the $V_{cntl}$ signal generated by charge pump system 22. Bias generator 24 is configured to reject supply noise by generating a constant bias current $I_b$ and an internal VCO supply voltage $V_{dd}-V_{rgb}$ (also referred to as the regulated bias generator voltage) which is matched to the VCO supply voltage $V_{dd}-V_{rg}$ (i.e., the regulated VCO voltage).

The feedback loop within the bias generator will adjust $V_{bn}$ so that $V_{replica}$ will match $V_{cntl}$. Diode-connected transistor 82 establishes a current based on its drain-to-source voltage bias. As long as the voltage between nodes $V_{dd}$ and $V_{replica}$ remains fixed, the current $I_b$ will remain fixed as well. $V_{cntl}$ is passively supply-referenced (to $V_{dd}$) through operation of capacitor 42, such that $V_{cntl}$ tracks variations in the supply voltage. Alternatively, $V_{cntl}$ may be supply-referenced to $V_{ss}$ or referenced to any other suitable reference value. $V_{replica}$ in turn is actively supply-referenced through operation of amplifier 80 and the other components of the feedback loop within bias generator 24. Accordingly, the drain-to-source voltage on transistor 82 is unaffected by supply voltage variation, so that biasing current $I_b$ is constant. Because bias generator 24 generates a bias current $I_b$ that is independent of $V_{dd}$ and a regulated bias generator voltage $V_{dd}-V_{rgb}$ that matches the regulated VCO voltage $V_{dd}-V_{rg}$, the current delivered through regulated node 182 to VCO stages 140 will be independent of $V_{dd}$. In other words, the current supplied to the VCO depends on the voltage difference between $V_{bn}$ and $V_{ss}$ (FIG. 3). The bias generator actively adjusts $V_{bn}$ in response to supply voltage changes to ensure that the biasing current $I_b$ (and thus, the VCO current) is independent of supply voltage changes. Accordingly, the oscillation frequency of VCO 30 is independent of supply voltage variations. As a result, the depicted exemplary embodiments of phase-locked loop 10 substantially reject noise coupled into the system from the supply, ground, substrate and other sources.

It will be appreciated that the noise rejection features discussed above typically depend on the bandwidth response of bias generator 24. Specifically, the bias generator must have enough bandwidth to make $V_{replica}$ track supply variations before they can have an impact on the output of VCO 30. An important advantage of the various PLL embodiments discussed herein is that the various components are designed to perform their respective functions without adversely affecting the bandwidth response of the bias generator. The noise rejection achieved by matching the bias generator to the regulated VCO supply voltage is implemented without any direct coupling of the bias generator to the regulated VCO supply voltage. This avoids adding capacitance to the bias generator feedback loop. This approach also makes it possible to precisely control the damping factor of the phase-locked loop through control of the gain of the proportional control path.

Additionally, in many settings it will be desirable for the phase-locked loop system to quickly achieve lock during a startup interval, or in other cases where a relatively large correction in output signal is required. Improved lock times will often provide significant speed and efficiency benefits for the overall system. Faster locking can also substantially reduce power consumption, both for the PLL itself and for the systems that depend upon or are connected to the PLL.

An example of a setting in which improved lock rates can be particularly beneficial are devices that intermittently revert to a "dormant" or "sleep" mode during periods of non-use. Typically, this is done in order to limit power consumption. To return to normal run-time operation, the device typically must go through a reset or startup routine, which will often will involve many of the same tasks that are performed when the device is first powered up. Clock acquisition is often one of the first tasks to be performed during reset. The faster that the PLL can lock onto the reference clock, the faster that the device can return to normal run-time operation, and the less power that will be consumed during startup. Startup/reset speed is important even when startup occurs infrequently, but becomes an even more important consideration in devices that frequently revert to a dormant state.

One way of quickly transitioning to a locked state is to run the PLL system with an elevated bandwidth response, for example through use of substantially higher charge pump currents than are employed during normal run-time operation. The higher charge pump currents lead to larger, more aggressive corrections in the output signal. One concern with this approach is that the relatively high bandwidth response is often the opposite of what is desired during normal run-time operation. In particular, during normal run-time operation, a relatively lower bandwidth is advantageous, and large aggressive corrections in the output signal typically are not required or desired. Rather, during normal run-time operation, the PLL system will use relatively small charge pump currents to repeatedly make many small corrections to maintain the system in a locked state. In fact, if bandwidth is too high, the PLL system may not adequately filter out clock jitter during normal operation.

Accordingly, in some prior systems, bandwidth is temporarily elevated during startup, and is then scaled back for normal operation of the system (e.g., while the PLL is close to or in a locked state). A large portion of the transition time (e.g., transitioning from a dormant to a locked state) is spent attempting to match the feedback clock frequency to the reference frequency. Only after the frequencies are matched is the final phase match accomplished.

In prior systems of which applicant is aware, some degree of inefficiency occurs as a result of the timing of the switch from the high to low bandwidth mode of operation. For example, in many systems, this timing is determined in advance during design of the system, based on conservative predictions about the operating environment and conditions that are likely to occur while the system is running. As a result, the prior systems often will switch over to low bandwidth operation sooner than necessary, resulting in longer lock acquisition times and increased power consumption during reset/startup operations. If a non-conservative, more aggressive timing is selected at design time, there is a risk of frequency overshoot and/or overcorrection. This is unacceptable in many settings. Indeed, many PLL systems cannot ever recover and achieve lock once the output signal overshoots and exceeds the reference frequency by more than a relatively small amount.

Figure 10:
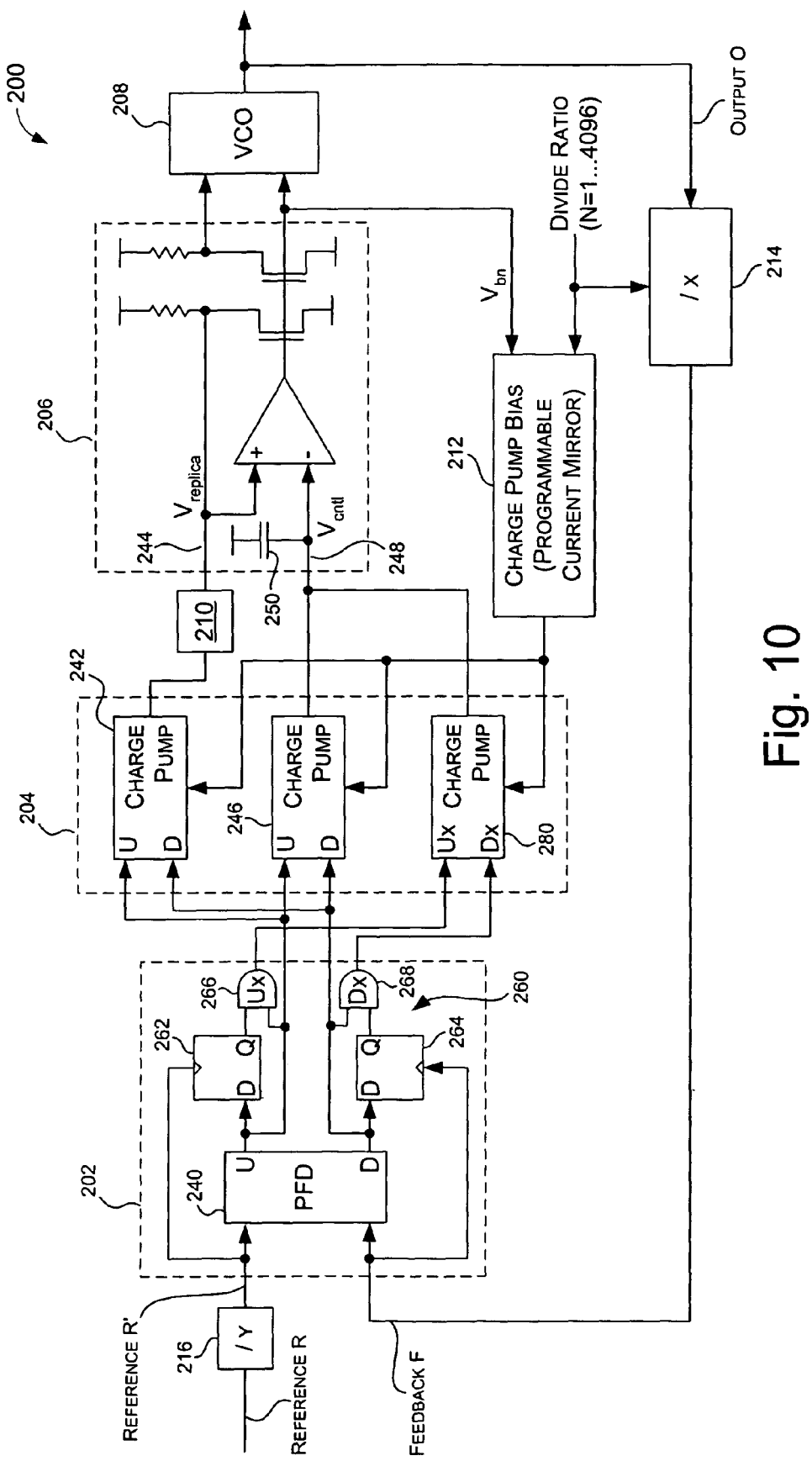
FIG. 10 depicts another embodiment of a phase-locked loop according to the present description.

FIG. 10 depicts another embodiment of a phase-locked loop system 200 according to the present description, which may be configured to provide improved, faster locking, particularly when the system is transitioning from a startup state to a run-time state, recovering from a dormant mode, or when other relatively large corrections in the output signal are needed. As will be explained in more detail below, faster locking may be achieved by providing an additional higher-current charge pump. In the present examples, the higher-current charge pump may be intermittently activated based on sensing of a predetermined condition, which is selected so to be readily detectable while the PLL is running.

System 200 is in many respects similar to the previously described embodiments. In particular, system 200 may include an error detector 202 coupled with a charge pump system 204, bias generator 206 and a VCO 208 in a feedback configuration so as to produce an output signal O with desired characteristics based on a reference signal R. As in the earlier-described examples, bias generator 206 may be isolated using buffers, current mirrors and the like (e.g., sections 210 and 212).

As in the previous embodiments, a feedback version F of the output signal O and a reference signal R' (e.g., a divided version of reference signal R) are applied as inputs to error detector 202. Dividers 214 and 216 may be provided in the feedback and/or reference input paths, respectively, for applications requiring multiplication and/or division of the reference frequency. Typically, error detector 202 produces an output error signal(s) which is dependent upon phase and/or frequency differences between the reference and output signals (or upon phase/frequency differences between divided versions of the reference and output signals). The error signal(s) is applied to charge pump system 204, which produces currents depending upon the error. The charge pump currents ultimately control the voltage which is applied to VCO 208, which in turn causes the phase and/or frequency of output signal O to vary and tend toward the desired values. As in previous embodiments, bias generator 206 may be configured to provide a dynamic biasing signal which self-biases the system, free of any predetermined or externally-applied bias levels.

Error detector 202 and/or charge pump system 204 may be provided with additional features to facilitate the locking process, particularly during startup or other situations where relatively large adjustments to the output signal are needed. According to one implementation, improved locking may be achieved by advance determination of a criteria or condition that, when satisfied, will result in the system making larger magnitude, more aggressive corrections to the output signal. While the criteria is satisfied, the larger corrections may be achieved, for example, by temporarily operating (e.g., during satisfaction of the condition) the system in a relatively high-bandwidth mode, as discussed above.

Various criteria may be used to determine when larger or more rapid corrections are made to the output signal. Normally, it will be desirable that the criteria be selected so as to be readily and easily detectable during operation of the PLL system. One example of such criteria may be seen with reference to FIG. 11, which depicts exemplary waveforms of a feedback signal F and a divided reference signal R' (see also FIG. 10), along with various other signals which will be explained. The exemplary illustrated criteria may be referred to as "cycle slippage," in which a complete reference cycle (e.g., a complete cycle of the R' reference signal) occurs during the current feedback cycle, or a complete feedback cycle occurs during the current reference cycle. Cycles may be measured with respect to consecutive triggering edges of a waveform. For example, rising edge R1 and rising edge R2 bound a first cycle of the reference signal R', and rising edge R2 and rising edge R3 bound a second cycle of the reference signal R'. Similarly, rising edge F1 and rising edge F2 bound a cycle of the feedback signal.

Figure 11:
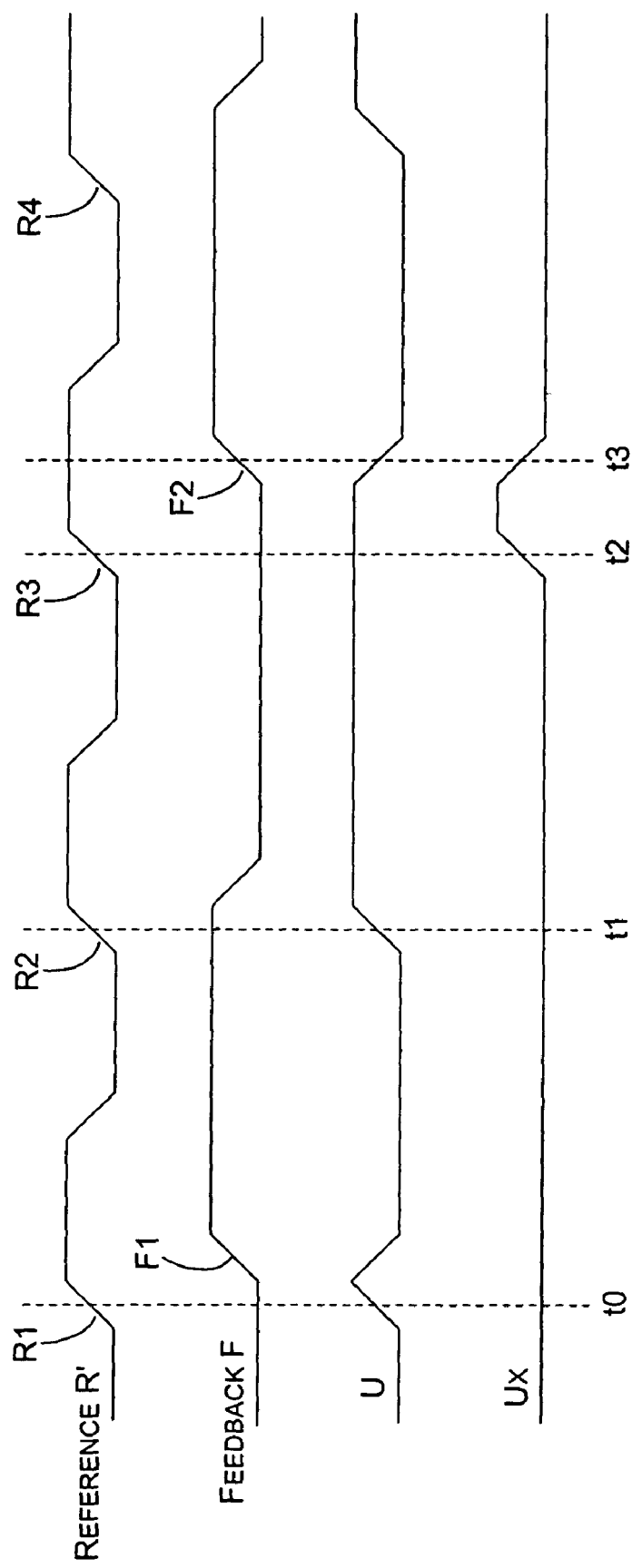
FIG. 11 depicts exemplary signal waveforms that may arise in the system of FIG. 10, and illustrates a criterion that may be used to control activation of a charge pump included in the system of FIG. 10.

Referring still to FIG. 11, cycle slippage has occurred at time t2 because two triggering edges (e.g., rising edge R2 and rising edge R3) of the reference signal R' have occurred during the current output cycle, which commenced with triggering edge F1. In other words, the cycle slippage criterion is satisfied at time t2 because an entire reference cycle has occurred during the current feedback cycle. As seen in the figure, this criterion is satisfied during the entire interval from time t2 to time t3. Detection of the cycle slippage may be used to activate a large-scale correction mechanism to adjust the frequency of the output signal. In the present example, the feedback signal has slipped a cycle (and the output signal thus is running at a lower frequency than desired), and must "catch up" to the reference signal.

Cycle slippage may also be understood in relation to the undivided reference signal and output signal in applications where the desired output frequency is to be x/y times the reference frequency. In this case, it is helpful to define output intervals of the output signal O and reference intervals of the reference signal R. A given output interval may be defined by (x/y+1) successive triggering edges of the output signal O. A given reference interval may be defined by two successive triggering edges of the reference signal R. Accordingly, the output signal O may be said to have slipped relative to the reference signal R when more than one triggering edge of the reference signal has occurred since commencement of the current output interval. The reference signal R may be said to have slipped relative to the output signal O when more than x/y triggering edges of the output signal O have occurred since commencement of the current reference interval.

As will be explained in more detail below, detection of the pre-determined criterion or condition (e.g., cycle slippage)

may be used to control activation of a corrective mechanism configured to make appropriate adjustment(s) to the output signal. Typically, as will be seen in certain examples below, the adjustment(s) that are made typically will be large and performed infrequently, relative to the adjustments made by the PLL system during run-time while the system is locked or very nearly locked.

For example, upon startup or recovery from a dormant mode, the PLL output typically will initially be much lower in frequency than desired (e.g., at a substantially lower frequency than the reference clock). Accordingly, it would be desirable to have a rapid, large magnitude increase in the output frequency. In the above cycle slip examples, the initial large discrepancy between the actual and desired output frequency would produce a cycle slip condition, thereby triggering activation of a correction mechanism different from that used during normal run-time operation, in that the correction mechanism is configured to produce more rapid, larger changes in the output signal, to speed up the locking process during startup or reset.

Referring again to FIG. 10, error detector 202 may include a phase frequency detector (PFD) 240 similar to that previously described, which includes U and D outputs. As in the previous embodiments, the state of the U and D outputs typically will depend on whether the feedback signal F lags or leads the reference signal R' in phase and/or frequency. As before, when the system is in lock, both the U and D outputs may be pulsed high to reduce or eliminate the "dead band" that can result in undesirable instability when the system is locked or nearly in lock.

Similar to the previous examples, the U and D outputs may be coupled with various charge pumps (e.g., integrating charge pumps, proportional charge pumps, etc.) within charge pump system 204. The U and D outputs may be coupled with a proportional charge pump 242, for example, that is coupled with and configured to pump charge to bias generator 206 via a proportional control path 244. The U and D PFD outputs may also be coupled to an integrating charge pump 246 that is coupled with and configured to pump charge to bias generator 206 via an integrating control path 248.

As discussed above, the integrating and proportional charge pumps typically are similar in construction and internal operation. Both pumps respond to the U and D error signals by pumping charge to bias generator 206, in order to produce adjustments to output signal O. Also, both pumps may be biased as previously explained via feedback coupling of a biasing signal $V_{bn}$ (or mirrored copy $V_{bn}'$) from bias generator 206.

The two charge pumps may be distinguished by the different signal pathways to bias generator 206, and by the way pumped charge is applied to the bias generator. Integrating charge pump 246 pumps its output charge along integrating control path 248 to the $V_{cntl}$ node of the bias generator. The pumped charge is integrated by and stored at capacitor C1 (250). The voltage on this capacitor represents the net accumulated charge resulting from all of the previously applied U and D signals to integrating charge pump 246.

In contrast, proportional charge pump 242 pumps its output charge via proportional control path 244 to the $V_{replica}$ node of bias generator 206. As discussed with respect to previous examples, the output charge typically is in the form of a current pulse which is added to or subtracted from a bias current flowing within a replica current path in the bias generator. In some cases, there may be various capacitances introduced into the proportional control path, though these capacitances typically are much smaller than capacitor 250. Accordingly, the proportional control provided by charge pump 242 normally involves small phase adjustments to the output signal, where the integrating control provided by integrating charge pump 246 typically involves more gradual accrued adjustments to the output signal, due to the accumulated charge on capacitor 250 and the filtering effects produced by the relatively large capacitance.

Error detector 202 may also include a section, sub-assembly or group of components, such as cycle slip detector 260, that is configured to assess, during operation of the PLL system, whether an alternate correction mechanism should be activated to achieve a desired correction in the output signal. As in the preceding discussion, typically this assessment involves determining whether a condition or criterion is satisfied which indicates or suggests that a relatively large or rapid correction in the output signal is needed. It will normally be desirable that the criterion or condition be fashioned so that it is readily ascertainable during operation of the PLL. Once this criterion is detected, the alternate correction mechanism is activated to achieve the desired correction (e.g., a rapid increase in frequency to reduce the time necessary to lock onto a desired reference value). Typically, the alternate correction mechanism is activated for the entire interval in which the criterion is satisfied.

In the depicted example, cycle slip detector 260 may include latches 262 and 264, and AND gates 266 and 268, and may be configured to detect cycle slippage occurring between the reference signal R' and feedback signal F. Specifically, the upper portion of cycle slip detector 260 detects when the feedback signal has slipped a cycle relative to the reference signal R'. In particular, the output of AND gate 266 goes high (i.e., the Ux signal) when more than one triggering edge of the reference signal R' has occurred since commencement of the current feedback cycle.

In contrast, the lower portion of cycle slip detector 260 is configured to detect when the reference signal R' has slipped a cycle relative to the feedback signal F. In this case, the output of AND gate 268 goes high (i.e., the Dx signal is pulsed) when more than one triggering edge of the feedback signal has occurred since commencement of the current reference cycle.

As shown in FIG. 10, the outputs of cycle slip detector 260 (i.e., the Ux and Dx outputs) may be coupled with a second integrating charge pump 280. Charge pump 280 differs from the other charge pumps in that it is configured to provide much higher currents upon activation than the charge pumps coupled to the U and D outputs of PFD 240 (e.g., charge pumps 242 and 246). Thus, during cycle slippage, charge pump 280 is activated to provide a higher-magnitude charge pump current. The Ux output is pulsed to provide an elevated current to rapidly increase the frequency of the output signal, while the Dx output is pulsed to rapidly decrease the frequency of the output signal.

Specifically, the elevated currents are rapidly integrated into an accumulated charge upon capacitor 250, thereby causing a rapid change in the voltage applied to VCO 208. Accordingly, the output signal frequency will rapidly increase or decrease until the slip condition is alleviated, at which point charge pump 280 will deactivate, thereby returning the PLL system to the lower current, lower bandwidth mode that results from normal operation of charge pumps 242 and 246 and that typically is more advantageous and desirable during normal run-time operation.

It should be appreciated that, in many applications, the usual startup or recovery scenario will be that the output signal is initially at a much lower frequency than desired. The exemplary rapid locking system and method described herein may then be employed to quickly bring the output signal into a frequency range where charge pumps 242 and 246 can then take over and provide the relatively small run-time phase adjustments necessary to maintain lock. Accordingly, it will be appreciated that the Dx signal may not be necessary for all applications, and it should be understood that the present systems and methods may be simplified to detect only slippage in one direction (e.g., with only a Ux signal).

Controlling a higher current charge pump with a cycle slip detector enables rapid and efficient adjustments to be made to the output signal, based on dynamic real-time sensing of current operating conditions. Cycle slip detection is advantageous in many PLL applications where, in practice, it can be difficult to determine if the PLL is in lock. In contrast, it is relatively easy to detect cycle slipping between the reference and feedback (output) clocks, and if the PLL is cycle slipping, it is definitely not locked. In several of the described exemplary systems and methods, the timing of cycle slips can be used as a measure of the frequency difference between the reference and feedback (output) signals, and this measurement can be used to directly and quickly adjust the VCO frequency so that the reference and feedback frequencies can be matched. Once the output and reference frequencies roughly match, the PFD and run-time charge pumps (e.g., charge pumps 242 and 246) can match the phases.

Referring again to FIG. 11, at time t3, a triggering edge such as rising edge F2 is seen on the feedback signal. The previous triggering edge on the output signal must have occurred between the rising reference edges at times t0 and t1, otherwise a reference cycle slip would have been detected earlier. The latest possible previous rising feedback edge would have been just before time t1. Accordingly, the feedback cycle must be at least t3-t2 longer than the reference cycle. Thus, the Ux waveform (e.g., one of the outputs of cycle slip detector 260) measures an approximation of the difference in cycle time between the reference signal R' and the feedback signal F when the feedback cycle is longer. The Ux signal never underestimates the difference by more than a reference cycle, and never overestimates the difference at all. Similarly, the Dx signal closely estimates but never overestimates the cycle time difference when the reference cycle is longer.

To accelerate locking in the described systems and methods, the cycle time difference estimated by the Ux and Dx signals may be correlated to a change in the VCO control voltage (e.g., the voltage applied to VCO 208). The VCOs employed in the present systems and methods typically are approximately linear in operation. Accordingly, to correct for all of the detected frequency difference, the desired change in $V_{cntl}$ would be as follows:

$$\Delta V_{cntl} = \frac{\Delta T}{T}(V_{ctl} - V_t),$$

where $\Delta T$ is the measured cycle time difference and T is the VCO cycle time. In practice, it may be desirable to make corrections that are some fixed fraction of this delta to improve the stability of the frequency convergence and eliminate frequency overshoot:

$\Delta Vcntlx = x\Delta Vcntl$, where $0 < x < 1$.

To provide this voltage change, a current $I_{chx}$ may be pumped into control capacitor 250 (which has a capacitance C1) for the duration of the cycle slip Ux or Dx pulse that indicates the approximated cycle time difference:

$$\Delta V_{cntlx} = \frac{I_{chx} \Delta T}{C_1}$$

The current $I_{chx}$ that will produce this voltage change on $V_{cntl}$ is:

$$I_{chx} = x\frac{C_1}{T}(V_{cntl} - V_t).$$

For a self-biased PLL as described in the present examples, the reference period and VCO buffer transconductance can be defined as:

$$T = \frac{N}{F_{VCO}} = \frac{NC_b}{g_m}$$

and $gm = k(Vcntl - Vt) = \sqrt{2kI_d}$, where N is the multiplication factor between the reference and the VCO frequency, $g_m$ is the transconductance inside each VCO buffer, $C_b$ is the effective VCO capacitance, such that $F_{VCO} = g_m/C_b$, and $I_d$ is the VCO buffer bias current. So then:

$$I_{chx} = x\frac{C_1 g_m^2}{C_b N k} = 2x\frac{C_1 I_d}{C_b N}.$$

Regarding this last equation, it should be understood that x, $C_l$, and $C_b$ are all parameters determined at design time, and N is a digital parameter associated with the PLL circuit. Accordingly, a ratioed current mirror may be used to generate $I_{chx}$ from the buffer bias current $I_d$, and the same fraction of frequency error x will always be corrected, regardless of frequency, process, or environmental conditions. In certain of the exemplary systems and methods described herein, the resulting predictability of convergence may provide various advantages, including reducing or eliminating instability and overshoot, and providing efficient convergence at the maximum possible rate.

The exemplary system described above and shown in FIG. 10 may be configured to implement these mathematical relationships. Specifically, as indicated, the Ux and Dx signals discussed above may drive an additional integrating charge pump with a current $I_{chx}$ that will generally be much larger than $I_{ch}$. Particularly, in a low-bandwidth PLL, $I_{ch}$ will be smaller than $I_d$. Typically, there is not a need for an equivalent proportional charge pump because the Ux and Dx signals typically are used only to accelerate frequency locking.

The exemplary embodiment just described may provide significant advantages in certain settings. The transition to lower bandwidth operation occurs at an optimal time in order to quickly move the output signal toward lock while avoiding the overshoot and tracking jitter problems that can result from running the system at an overly high bandwidth or from making the high-to-low bandwidth transition too late. Also, the transition is not made too soon, as in many prior systems, thereby avoiding unnecessary delays in achieving lock. The rapid locking mechanism described in the example is configured to flexibly and dynamically address operating conditions in real time as they occur, in contrast to conventional prior systems, which often rely on conservative design time approximations.

It should be appreciated that the corrections activated upon detection of cycle slips differ in several ways from the adjustments made while the system is locked or nearly locked. Typically, as already mentioned, the correction is much larger in magnitude than the corrections made while the system is in lock or nearly locked. As previously indicated, the C1 capacitance in the described examples is typically quite large, and thus the $C1/C_b$ term in the above equation is often sizable, say 1000 or greater. This produces charge pump currents from charge pump 280 that are often orders of magnitude greater than the currents produced by charge pumps 242 and 246. As a result, the currents generated by pump 280 rapidly produce relatively large adjustments in the frequency of output signal O, while the currents from the other pumps produce relatively small phase corrections in the output signal.

In addition, charge pump 280 typically activates much less frequently than pumps 242 and 246, which are more or less constantly pump quantities of charge during operation of the PLL to make the small phase adjustments necessary to maintain lock. In contrast, in typical applications, charge pump 280 commonly will produce between one and five large bursts of current during startup or recovery from a dormant condition, and then will not operate again until the next time that the system is powered up or recovering from dormancy. Indeed, those skilled in the art will appreciate that phase-locked loop systems are commonly designed to operate within a design specification that calls for phase deviations to not exceed a certain threshold during normal operation. For example, a typical specification might require that the PLL not exceed 5% phase deviation during normal run-time operation (e.g., when the PLL is locked or nearly locked). With this common specification (e.g., less than 5% phase deviation during normal run-time operation), the higher-current charge pumps of the exemplary embodiments described herein would never turn on during normal run-time, and would only be activated to facilitate rapid locking during startup or recovery modes.

It should also be understood that the present description encompasses a phase-locked loop method and/or a method for effecting rapid corrections in an output signal of a phase-locked loop, and that such methods may be employed in connection with, or independently of, the specific system implementations described herein. The method(s) may generally include causing an output signal to tend toward or acquire a desired characteristic, such as a particular frequency and/or phase, where the desired characteristic is based on a reference signal applied to the PLL. In addition, the method may include detecting whether cycle slippage has occurred between two signals, or whether some other condition exists that is readily ascertained during operation of the PLL. Typically, when cycle slippage is tested for or sensed, the slippage criterion is determined in relation to periodic signals that are applied as inputs to a phase frequency detector of the PLL. When slippage is found (or when the other condition is determined to exist), an alternate correction mechanism is activated to produce a change in the output signal. In typical implementations, the alternate correction is a more rapid change in the output signal than would otherwise be employed, for example a rapid increase in the frequency to speed the locking process during startup of the PLL. As discussed above, the alternate correction may be implemented as a temporary activation of a large-magnitude current, where such activation only occurs when cycle slippage is detected.

While the present invention has been particularly shown and described with reference to the foregoing preferred embodiments, those skilled in the art will understand that many variations may be made therein without departing from the spirit and scope of the invention as defined in the following claims. The description of the invention should be understood to include all novel and non-obvious combinations of elements described herein, and claims may be presented in this or a later application to any novel and non-obvious combination of these elements. Where the claims recite "a" or "a first" element or the equivalent thereof, such claims should be understood to include incorporation of one or more such elements, neither requiring nor excluding two or more such elements.

What is claimed is:

1. A fast-locking phase-locked loop system configured to produce an output signal having a desired characteristic based on an applied reference signal, comprising:
   a voltage controlled oscillator configured to produce the output signal;
   a charge pump system operatively coupled with the voltage controlled oscillator and configured to generate currents that control the phase and frequency of the output signal produced by the voltage controlled oscillator, where the charge pump system includes:
     at least one rim-time charge pump configured to repeatedly pump charge during run-time operation of the phase-locked loop so as to produce ongoing phase adjustments of the output signal as needed to maintain the phase-locked loop in a locked condition; and
     at least one additional charge pump configured to provide a charge pump current of substantially larger magnitude than that provided by the run-time charge pump so as to provide frequency adjustment of the output signal upon detection of cycle slippage between the output signal and the reference signal; and
   an error detector operatively coupled with the charge pump system and configured to provide an error signal to the charge pump system upon which the charge pump currents are based, where the error detector includes a cycle slip detector configured to detect cycle slippage between the output signal and the reference signal, and where the cycle slip detector is configured to apply an activating signal to the additional charge pump upon detection of cycle slippage occurring between the output signal and the reference signal, the cycle slip detector including edge-triggered latches coupled with U and D outputs of a phase frequency detector.

2. The system of claim 1, where the latches are triggered by edges of input signals applied to the phase frequency detector.

3. A fast-locking phase-locked loop system configured to produce an output signal having a desired characteristic based on an applied reference signal, comprising:
   a voltage controlled oscillator configured to produce the output signal;
   a charge pump system operatively coupled with the voltage controlled oscillator and configured to generate currents that control the phase and frequency of the output signal produced by the voltage controlled oscillator, where the charge pump system includes:
  at least one run-time charge pump configured to repeatedly pump charge during run-time operation of the phase-locked loop so as to produce ongoing phase adjustments of the output signal as needed to maintain the phase-locked loop in a locked condition; and
  at least one additional charge pump configured to provide a charge pump current of substantially larger magnitude than that provided by the run-time charge pump so as to provide frequency adjustment of the output signal upon detection of cycle slippage between the output signal and the reference signal; and
a bias generator operatively coupled with the voltage controlled oscillator and configured to generate a biasing current and an associated biasing signal based on differences between the output signal and the desired characteristic, where the phase-locked loop system is configured so that:
  the biasing current produces a regulated bias generator voltage within the bias generator;
  the voltage controlled oscillator produces the output signal in response to a VCO current generated via application of the biasing signal from the bias generator;
  the VCO current produces a regulated VCO voltage within the voltage controlled oscillator; and
  the regulated bias generator voltage matches the regulated VCO voltage free of any direct coupling between the bias generator and the regulated VCO voltage.

4. The system of claim 3, where the bias generator is configured to dynamically generate the biasing signal free of any predetermined external bias.

5. The system of claim 3, where the voltage controlled oscillator includes a plurality of VCO stages.

6. The system of claim 5, where the VCO stages are coupled in parallel between a positive voltage supply and a regulated ground node.

7. The system of claim 6, where the VCO current is produced by a VCO current source that is biased by the biasing signal, and where the VCO current source is coupled in series between a negative voltage supply and the regulated ground node.

8. The system of claim 6, where the VCO stages are coupled in parallel between a negative voltage supply and a regulated supply node.

9. The system of claim 8, where the VCO current is produced by a VCO current source that is biased by the biasing signal, and where the VCO current source is coupled in series between a positive voltage supply and the regulated supply node.

10. A fast-locking phase-locked loop system configured to produce an output signal having a desired characteristic based on an applied reference signal, comprising:
  a voltage controlled oscillator configured to produce the output signal;
  a charge pump system operatively coupled with the voltage controlled oscillator and configured to generate currents that control the phase and frequency of the output signal produced by the voltage controlled oscillator, where the charge pump system includes:
    at least one run-time charge pump configured to repeatedly pump charge during run-time operation of the phase-locked loop so as to produce ongoing phase adjustments of the output signal as needed to maintain the phase-locked loop in a locked condition; and
    at least one additional charge pump configured to provide a charge pump current of substantially larger magnitude than that provided by the run-time charge pump so as to provide frequency adjustment of the output signal upon detection of cycle slippage between the output signal and the reference signal;
  where the charge pump system and voltage controlled oscillator are configured to be driven at least partially in response to application of a shared biasing signal which is generated bused on detected differences between the output signal and the desired characteristic, and where the biasing signal is coupled into the charge pump system via an isolated input path configured to inhibit undesired signal coupling from the charge pump system to the voltage controlled oscillator via the shared biasing signal.

11. The system of claim 10, where the isolated input path includes a current mirror configured to produce a minored copy of the biasing signal for use within the charge pump system.

12. The system of claim 10, further comprising a bias generator configured to dynamically generate the biasing signal free of any predetermined external bias.

13. The system of claim 10, where the voltage controlled oscillator includes a current source and a plurality of VCO stages connected to the current source via a regulated voltage node, the voltage controlled oscillator being configured to produce the output signal based upon current supplied via the regulated voltage node to the plurality of VCO stages.

14. The system of claim 10, where the biasing signal is generated by a bias generator that matches an effective impedance of the voltage controlled oscillator so that current supplied to the voltage controlled oscillator is substantially independent of supply and substrate noise.

15. A fast-locking phase-locked loop system configured to produce an output signal having a desired characteristic based on an applied reference signal, comprising:
  a voltage controlled oscillator configured to produce the output signal;
  a charge pump system operatively coupled with the voltage controlled oscillator and configured to generate currents that control the phase and frequency of the output signal produced by the voltage controlled oscillator, where the charge pump system includes:
    at least one run-time charge pump configured to repeatedly pump charge during run-time operation of the phase-locked loop so as to produce ongoing phase adjustments of the output signal as needed to maintain the phase-locked loop in a locked condition; and
    at least one additional charge pump configured to provide a charge pump current of substantially larger magnitude than that provided by the run-time charge pump so as to provide frequency adjustment of the output signal upon detection of cycle slippage between the output signal and the reference signal; and
  a bias generator configured to generate a biasing signal via operation of a feedback loop responsive to currents generated by the charge pump system, where the voltage controlled oscillator is configured to produce the output signal in response to application of the biasing signal,
  where charge pump output is applied to the bias generator along a proportional control path and an integrating control path, the proportional control path including a current mirror isolation mechanism to prevent capacitance on the proportional control path from affecting dynamic response of the bias generator feedback loop.

16. A phase-locked loop system, comprising:
a voltage controlled oscillator coupled with an error detector in a feedback configuration so as to produce an output signal having a desired characteristic that is based on a reference signal;
a charge pump system coupled with the voltage controlled oscillator and configured to produce currents to control phase and frequency of the output signal, where the charge pump system includes at least two charge pumps, one such charge pump being configured to deliver a higher charge pump current than the other to produce more rapid changes in the output signal than the other charge pump, and where the phase-locked loop system is configured to intermittently activate the higher-current charge pump upon satisfaction of a predetermined condition, where such predetermined condition is selected so as to be determinable during operation of the phase-locked loop; and
a bias generator operatively coupled with the voltage controlled oscillator and configured to generate a biasing current and an associated biasing signal based on differences between the output signal and the desired characteristic, where the phase-locked loop system is configured so that:
the biasing current produces a regulated bias generator voltage within the bias generator;
the voltage controlled oscillator produces the output signal in response to a VCO current generated via application of the biasing signal from the bias generator;
the VCO current produces a regulated VCO voltage within the voltage controlled oscillator; and
the regulated bias generator voltage matches the regulated VCO voltage free of any direct coupling between the bias generator and the regulated VCO voltage.

17. The system of claim 16, where the bias generator is configured to dynamically generate the biasing signal free of any predetermined external bias.

18. The system of claim 16, where the voltage controlled oscillator includes a plurality of VCO stages.

19. The system of claim 16, where the VCO stages are coupled in parallel between a positive voltage supply and a regulated ground node.

20. The system of claim 19, where the VCO current is produced by a VCO current source that is biased by the biasing signal, and where the VCO current source is coupled hi series between a negative voltage supply and the regulated ground node.

21. The system of claim 19, where the VCO stages are coupled in parallel between a negative voltage supply and a regulated supply node.

22. The system of claim 21, where the VCO current is produced by a VCO current source that is biased by the biasing signal, and where the VCO current source is coupled in series between a positive voltage supply and the regulated supply node.

23. A phase-locked loop system, comprising:
a voltage controlled oscillator coupled with an error detector in a feedback configuration so as to produce an output signal having a desired characteristic that is based on a reference signal; and
a charge pump system coupled with the voltage controlled oscillator and configured to produce currents to control phase and frequency of the output signal,
where the charge pump system includes at least two charge pumps, one such charge pump being configured to deliver a higher charge pump current than the other to produce more rapid changes in the output signal than the other charge pump, and where the charge pump system and voltage controlled oscillator are configured to be driven at least partially in response to application of a shared biasing signal which is generated based on detected differences between the output signal and the desired characteristic, and where the biasing signal is coupled into the charge pump system via an isolated input path configured to inhibit undesired signal coupling from the charge pump system to the voltage controlled oscillator via the shared biasing signal.

24. The system of claim 23, where the isolated input path includes a current mirror configured to produce a mirrored copy of the biasing signal for use within the charge pump system.

25. The system of claim 23, further comprising a bias generator configured to dynamically generate the biasing signal free of any predetermined external bias.

26. The system of claim 23, where the biasing signal is generated by a bias generator that matches an effective impedance of the voltage controlled oscillator so that current supplied to the voltage controlled oscillator is substantially independent of supply and substrate noise.

27. A phase-locked loop system, comprising:
a voltage controlled oscillator coupled with an error detector in a feedback configuration so as to produce an output signal having a desired characteristic that is based on a reference signal;
a charge pump system coupled with the voltage controlled oscillator and configured to produce currents to control phase and frequency of the output signal, where the charge pump system includes at least two charge pumps, one such charge pump being configured to deliver a higher charge pump current than the other to produce more rapid changes in the output signal than the other charge pump; and
a bias generator configured to generate a biasing signal via operation of a feedback loop responsive to currents generated by the charge pump system, where the voltage controlled oscillator is configured to produce the output signal in response to application of the biasing signal,
and where charge pump output is applied to the bias generator along a proportional control path and an integrating control path, the proportional control path including a current mirror isolation mechanism to prevent capacitance on the proportional control path from affecting dynamic response of the bias generator feedback loop.

28. The fast-locking phase-locked loop system of claim 1, where charge pump current is derived from a bias current inside the voltage controlled oscillator.

29. The fast-locking phase-locked loop system of claim 3, where charge pump current is derived from a bias current inside the voltage controlled oscillator.

30. The fast-locking phase-locked loop system of claim 10, where charge pump current is derived from a bias current inside the voltage controlled oscillator.

31. The fast-locking phase-locked loop system of claim 15, where charge pump current is derived from a bias current inside the voltage controlled oscillator.

32. The phase-locked loop system of claim 16, where charge pump current is derived from a bias current inside the voltage controlled oscillator.

33. The phase-locked loop system of claim 23, where charge pump current is derived from a bias current inside the voltage controlled oscillator.

* * * * *